United States Patent [19]

DeTizio et al.

[11] Patent Number: 4,754,370
[45] Date of Patent: Jun. 28, 1988

[54] ELECTRICAL COMPONENT WITH ADDED CONNECTING CONDUCTING PATHS

[75] Inventors: James R. DeTizio, Chatham Township, Morris County; Donald H. Smith, Parsippany-Troy Hills, both of N.J.

[73] Assignee: American Telephone and Telegraph Company, AT&T Bell Laboratories, Murray Hill, N.J.

[21] Appl. No.: 900,558

[22] Filed: Aug. 26, 1986

[51] Int. Cl.$^4$ .............................................. H05K 01/18
[52] U.S. Cl. .............................. 361/404; 174/52 FP; 361/406; 361/414
[58] Field of Search ........................ 361/404, 406, 414; 174/52 FP

[56] References Cited

U.S. PATENT DOCUMENTS

| | | | |
|---|---|---|---|
| 2,927,251 | 3/1960 | Jones et al. | 174/68.5 X |
| 3,670,208 | 6/1972 | Hovnanian et al. | 361/414 X |
| 3,959,579 | 5/1976 | Johnson | 174/52 FP X |
| 4,047,132 | 9/1977 | Krajewski | 361/414 X |
| 4,288,841 | 9/1981 | Gogal | 174/52 FP X |
| 4,372,037 | 2/1983 | Scapple et al. | 174/52 FP X |
| 4,591,950 | 5/1986 | Houpt | 361/406 |
| 4,628,411 | 12/1986 | Balderes et al. | 361/414 |
| 4,677,529 | 6/1987 | Watanabe et al. | 361/414 |

Primary Examiner—R. R. Kucia
Attorney, Agent, or Firm—Alfred G. Steinmetz

[57] ABSTRACT

An electrical component for mounting on a circuit substrate densely populated with conducting paths, includes interconnecting conductor paths included within the electrical component and unrelated to the electrical device supported by the component support structure in order to provide an interconnection between two conducting paths of the circuit substrate.

7 Claims, 3 Drawing Sheets

ELECTRICAL COMPONENT WITH ADDED CONNECTING CONDUCTING PATHS

The Government has rights in this invention pursuant to Contract No. N00024-81-C-7318 awarded by Department of the Navy.

This invention relates to circuits having a high density array of conducting paths and more particularly to supplying additional conduction paths in a high density conducting path environment.

BACKGROUND OF THE INVENTION

As power supply and other circuits increase in power density and are reduced in size, it has become increasingly difficult to provide the desired number of isolated high current conducting paths on a single circuit substrate. In particular the circuit topology frequently requires nonintersecting conducting paths to cross over one another. In a hybrid thick film technology this requires that a first conducting path deposited on the substrate be subsequently covered with a layer of dielectric material on which a second conducting path crossing the first conducting path is deposited. In a particularly dense or congested circuit arrangement several such layers and multilayers at one location of the substrate may be required. Not only is construction of these layers difficult and expensive, but the current in one conducting path may interfere with a conducting path either under it or overlaid thereon. This occurs frequently when one conducting path conducts a heavy current load as compared with the other conducting path. Other problems arise, when many conducting path overlays are necessary, including conducting path distortions due to curvature of the path as the overlaying path bridges a lower path. This curvature often distorts the cross section of the overlaying conducting path causing resistance variation problems. Therefore, avoidance of overlaid conducting paths is desirable both from an expense of production consideration and from an electrical performance consideration.

BRIEF DESCRIPTION OF THE INVENTION

Additional conducting paths are provided in high density circuits in accord with the invention by providing connecting conducting paths in components mounted on the circuit substrate and which particular conducting paths are utilized solely to interconnect two points on the substrate with a high current conducting path that is unrelated to the electrical function of the component's electrical device.

In a particular embodiment of the invention a surface mounted magnetic component such as an inductor or transformer on a hybrid thick film circuit layered in turn on a ceramic substrate is used to provide connecting conducting paths. This magnetic component includes independent connecting conduction paths on a plastic base on which the magnetic element is mounted that interconnect two added or unused terminal members on the periphery of the base. These connecting conductor paths are electrically joined to existing conducting paths on the substrate at these terminal members. These independent connecting conducting paths are unrelated as part of the component to the magnetic element (i.e. transformer or inductor) and its winding terminations and operates solely to provide additional connecting conducting paths that normally would have to be overlaid or deposited on the ceramic substrate. It is readily apparent that this provides an inexpensive and viable method of providing high current crossing conduction paths in very congested density populated portions of the substrate requiring many crossing conductor paths.

BRIEF DESCRIPTION OF THE DRAWINGS

An appreciation of the invention may be readily attained by reference to the following specification and the accompanying drawing in which.

DETAILED DESCRIPTION

Figure 1:
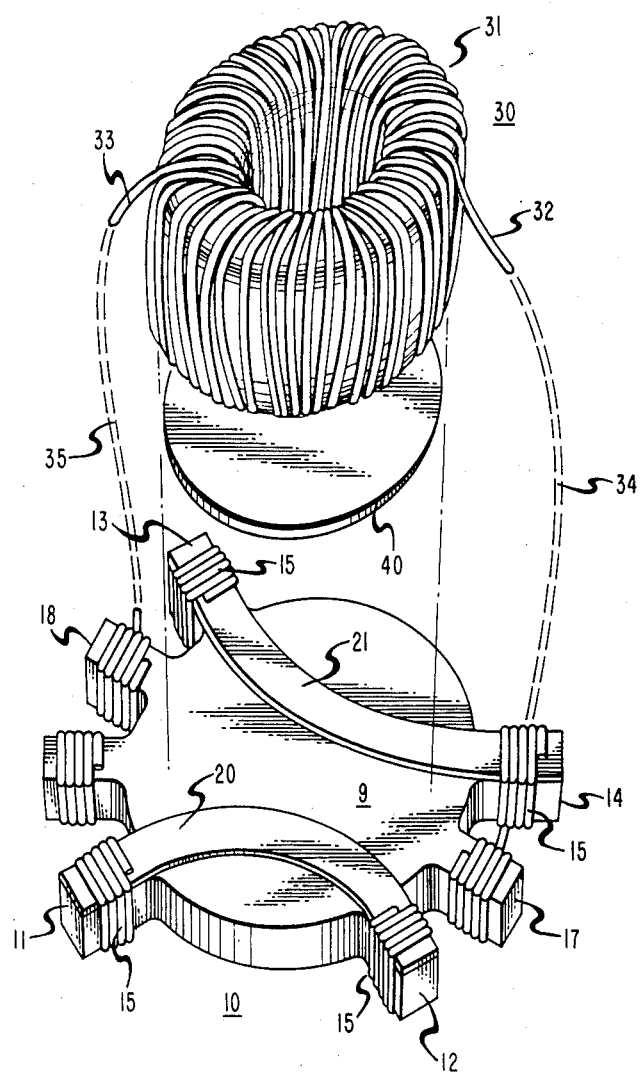
FIG. 1 is an exploded perspective view of a surface mountable inductor including independent conduction paths in accordance with the principles of the invention.

A simple surface mountable inductor structure including auxiliary connecting conducting paths illustrative of the principles of the invention is disclosed in an exploded perspective view in FIG. 1 of the drawing. A base structure 10 is shown including connecting conductor paths 20 and 21 placed on a top surface 9 of the base 10 and interconnecting opposing mounting tabs of the base 10. Connecting conducting path 20, a thin copper sheet strip is secured to the top surface 9 of base 10, interconnects the two component mounting tabs 11 and 12. Connecting conducting path 21, also a copper sheet strip, interconnects mounting tabs 13 and 14. In each instance the sheet conducting path and the tab it connects to is wrapped with tinned copper wire 15 to permit subsequent reflow surface mounting. While the illustrative embodiment herein depicts sheet copper conducting paths, it is readily apparent that many other methods of providing conduction paths may be utilized without departing from the spirit and scope of the invention.

The toroid core 30 which may be composed of a ferrite material is shown including a winding 31 whose terminal ends 32 and 33 (as shown by dotted lines 34 and 35) are intended to be connected to the mounting tabs 17 and 18 and wrapped with tinned wire 15 to permit reflow surface mounting. At reflow temperature the tinned solder melts and when it solidifies it provides an electrical connection to the component footprints or conduction lands on the substrate and also secures the component to the substrate. An insulation layer 110 is positioned between the toroid structure and the base surface 9 to electrically isolate the core 30 and winding 31 from the connecting conducting paths 20 and 21.

Figure 2:
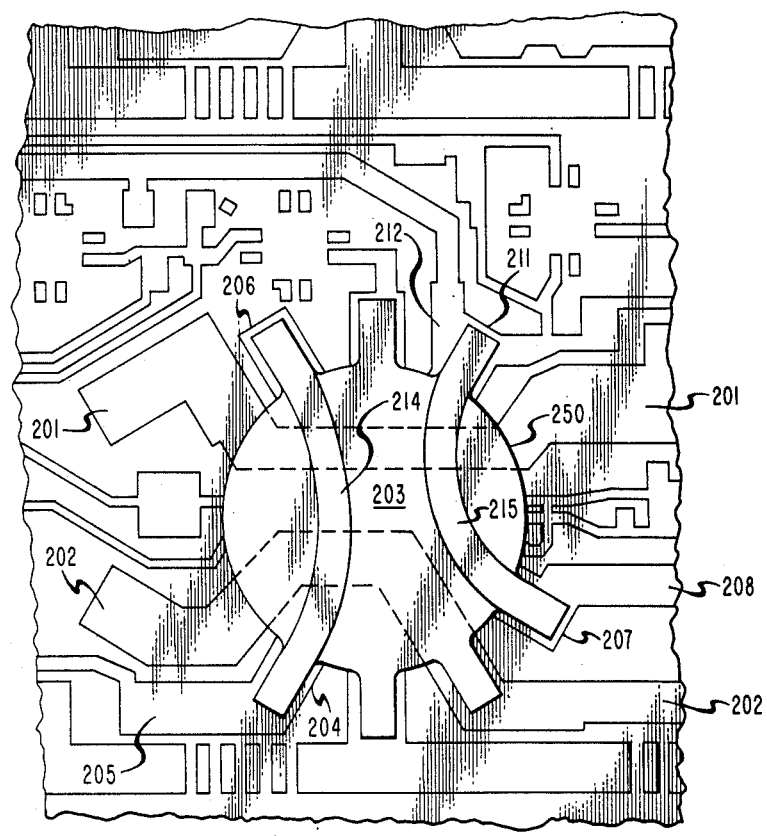
FIG. 2 discloses a surface view of a hybrid thick film circuit layered on a ceramic substrate with an outline of the base portion of the component and the connecting conducting paths plotted thereon showing where the surface mounted inductor of FIG. 1 is applied to provide additional crossing connecting conducting paths on a substrate densely populated with conducting paths.

A typical conduction path layout of a circuit deposited on a ceramic substrate 200 is shown in FIG. 2 with a defined outline 250 of the electrical component of FIG. 1 overlaid thereon in order to show how the connecting conducting paths are used to interconnect conducting paths deposited on the ceramic substrate. Two heavy duty conducting paths 201 and 202 are shown passing under the base area 203 of the component (defined by line 250) which is covered by the electrical component. It is desired to provide interconnections to the circuit via additional conducting paths that bridge both of these heavy duty conducting paths 201 and 202. In particular it is desired to connect a terminus 204 of conducting path 205 to a conducting land 206 and a terminus 207 of conducting path 208 to a terminus 211 of conducting path 212. In order to accomplish this, connecting conducting paths 214 and 215 are provided on the base of the electrical component rather than overlaying and depositing conducting paths on the substrate itself. These connecting conducting paths 214 and 215 are added to the component base structure solely as connecting conducting paths and have no relation to the operation or functioning of the component's electrical device.

Figure 3:
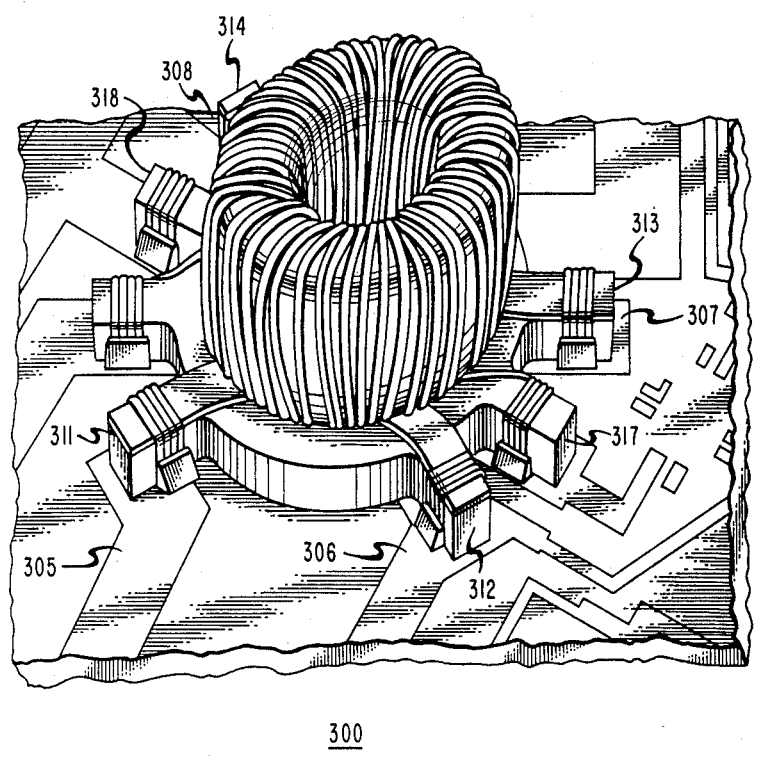
FIG. 3 depicts a surface mountable inductor mounted on a ceramic substrate in order to provide additional crossover connecting conducting paths independent of the functioning of the inductor.

A perspective view of the electrical component surface mounted on a circuit substrate 300 (shown in fragmentary form) is shown in FIG. 3. The terminal members 317 and 318 connect the electrical device (inductor 350) of the component to the circuit conducting paths at the substrate. The tabs 311 and 312 represent the ends of one connecting conducting path and electrically connect the conducting leads 305 and 306. Similarly, tabs 313 and 314 are the end at another connecting conducting path joining the conducting leads 307 and 308.

What is claimed is:

1. In combination:
   a circuit substrate including first and second conducting paths to be electrically connected without significant voltage drop therebetween except that of a connecting conductor,
   an electrical component adapted for mounting on the circuit substrate and comprising:
   an electrical device,
   a base member for supporting the electrical device which includes a first group of tab members solely dedicated for accepting terminal leads of the electrical device and faciliting their connection to a circuit on the circuit substrate;
   a connecting conducting path mounted on the base member which is unrelated to a functioning of the electrical device;
   a second group of tab members including
   first and second added tab members solely dedicated for connection to the ends of the connecting conducting path
   the first and second added tab members being positioned to connect electrically with the first and second conducting paths when the electrical component is mounted on the circuit substrate.

2. The combination as defined in claim 1 wherein the connecting conducting path comprises a copper strip which is secured to the first and second added tab members by tinned wire wrapped around the added tab members.

3. The combination as defined in claim 2 and further including
   a second connecting conducting path mounted on the base member and
   third and fourth added tab members to which ends of the second connecting conducting path are connected.

4. In combination:
   a circuit substrate having a common surface;
   first and second conducting paths on the common surface of said circuit substrate to be electrically connected to each other;
   an electrical component adapted for mounting on said substrate and including;
   an electrical device;
   a base member for supporting the electrical device to be positioned on the substrate contiguous to the first and second conducting paths comprising;
   tab members for accepting terminal leads of the electrical device;
   a connecting conducting path mounted on the base member independent of operative functions of the electrical device;
   first and second added tab members to which the connecting conductive path is connected;
   the first and second added tab members being positioned to connect electrically with the first and second conducting paths when the electrical component is mounted on the common surface on the circuit substrate.

5. The combination as defined in claim 4 wherein:
   the connecting conducting path comprises a flat copper conductor joined to the first and second added tab means by tinned wire.

6. The combination as defined in claim 5 and further including:
   third and fourth conducting paths on the common surface said circuit substrate,
   a second connecting conducting path mounted on the base member, and
   third and fourth added tab means to which the second connecting conducting path is connected,
   the third and fourth added tab means being positioned to connect electrically with the third and fourth conducting paths when the electrical component is mounted on the circuit substrate.

7. A combination as defined in claim 6 wherein the electrical component is surface mounted on said substrate.

* * * * *